(12) United States Patent
Clatterbuck et al.

(10) Patent No.: US 8,747,697 B2
(45) Date of Patent: Jun. 10, 2014

(54) GALLIUM-SUBSTITUTED YTTRIUM ALUMINUM GARNET PHOSPHOR AND LIGHT EMITTING DEVICES INCLUDING THE SAME

(75) Inventors: David Clatterbuck, Raleigh, NC (US); Brian Thomas Collins, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 362 days.

(21) Appl. No.: 13/154,872

(22) Filed: Jun. 7, 2011

(65) Prior Publication Data

US 2012/0313124 A1     Dec. 13, 2012

(51) Int. Cl.
*C09K 11/80*     (2006.01)
*H01J 1/62*      (2006.01)

(52) U.S. Cl.
USPC ............. 252/301.4 R; 252/301.4 F; 313/503; 313/486; 313/487; 257/98

(58) Field of Classification Search
USPC ............. 252/301.4 R, 301.4 F; 313/503, 486, 313/487; 257/98
See application file for complete search history.

(56) References Cited

U.S. PATENT DOCUMENTS

| | | | |
|---|---|---|---|
| 4,918,497 A | 4/1990 | Edmond | |
| 4,966,862 A | 10/1990 | Edmond | |
| 5,027,168 A | 6/1991 | Edmond | |
| 5,210,051 A | 5/1993 | Carter | |
| 5,338,944 A | 8/1994 | Edmond et al. | |
| 5,359,345 A | 10/1994 | Hunter | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond | |
| 5,631,190 A | 5/1997 | Negley et al. | |
| 5,739,554 A | 4/1998 | Edmond et al. | |
| 5,912,477 A | 6/1999 | Harris et al. | |
| 5,998,925 A * | 12/1999 | Shimizu et al. | 313/503 |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,515,314 B1 * | 2/2003 | Duggal et al. | 257/184 |
| 6,600,175 B1 | 7/2003 | Baretz et al. | |
| 6,791,119 B2 | 9/2004 | Slater et al. | |
| 6,853,010 B2 | 2/2005 | Slater et al. | |
| 6,958,497 B2 | 10/2005 | Emerson et al. | |
| 7,095,056 B2 | 8/2006 | Vitta et al. | |

(Continued)

FOREIGN PATENT DOCUMENTS

| EP | 1 121 000 A2 | 8/2001 | ............. H05B 33/14 |
|---|---|---|---|
| EP | 1121000 | *  8/2001 | |

(Continued)

OTHER PUBLICATIONS

Translation for JP 2005-260256, Sep. 2005.*

(Continued)

*Primary Examiner* — Carol M Koslow
(74) *Attorney, Agent, or Firm* — Brinks Gilson & Lione

(57) ABSTRACT

Provided herein are phosphor compositions that include a YAG phosphor that is substituted with gallium, such as $Y_a Ce_b Al_c Ga_d O_z$, wherein a, b, c, d and z are positive numbers. Also provided are solid state light emitting devices that include a YAG phosphor that is substituted with gallium.

30 Claims, 15 Drawing Sheets

(56) References Cited

U.S. PATENT DOCUMENTS

| | | | |
|---|---|---|---|
| 7,213,940 B1 | 5/2007 | Van de Ven et al. | |
| 7,235,189 B2 * | 6/2007 | Hohn et al. | 252/301.36 |
| 7,391,060 B2 * | 6/2008 | Oshio | 257/98 |
| 7,456,499 B2 | 11/2008 | Loh et al. | |
| 7,564,180 B2 | 7/2009 | Brandes | |
| 2004/0256974 A1 | 12/2004 | Mueller-Mach et al. | |
| 2006/0221272 A1 | 10/2006 | Negley et al. | |
| 2007/0139923 A1 | 6/2007 | Negley et al. | |
| 2007/0158668 A1 | 7/2007 | Tarsa et al. | |
| 2007/0170447 A1 | 7/2007 | Negley et al. | |
| 2007/0221865 A1 | 9/2007 | Sohn et al. | 250/484.4 |
| 2007/0223219 A1 | 9/2007 | Medendorp et al. | |
| 2007/0253209 A1 | 11/2007 | Loh et al. | |
| 2008/0012036 A1 | 1/2008 | Loh et al. | |
| 2008/0121921 A1 | 5/2008 | Loh et al. | |
| 2008/0149166 A1 * | 6/2008 | Beeson et al. | 136/248 |
| 2008/0149957 A1 * | 6/2008 | Kameshima et al. | 257/98 |
| 2008/0173884 A1 | 7/2008 | Chitnis et al. | |
| 2008/0179611 A1 | 7/2008 | Chitnis et al. | |
| 2008/0198112 A1 | 8/2008 | Roberts | |
| 2008/0258602 A1 | 10/2008 | Masuda et al. | |
| 2008/0283864 A1 | 11/2008 | LeToquin et al. | |
| 2008/0308825 A1 | 12/2008 | Chakraborty et al. | |
| 2009/0050907 A1 | 2/2009 | Yuan et al. | |
| 2009/0050908 A1 | 2/2009 | Yuan et al. | |
| 2009/0080185 A1 | 3/2009 | McMillan | |
| 2009/0108281 A1 | 4/2009 | Keller et al. | |
| 2009/0184616 A1 | 7/2009 | Van de Ven | |
| 2009/0218581 A1 | 9/2009 | Schmidt et al. | |
| 2009/0283721 A1 | 11/2009 | Liu et al. | |
| 2010/0040769 A1 * | 2/2010 | Chen | 427/67 |
| 2010/0252851 A1 | 10/2010 | Emerson et al. | |
| 2010/0289044 A1 | 11/2010 | Krames et al. | |
| 2010/0294939 A1 * | 11/2010 | Kuntz et al. | 250/361 R |
| 2011/0220929 A1 | 9/2011 | Collins et al. | |

FOREIGN PATENT DOCUMENTS

| | | | |
|---|---|---|---|
| JP | 01-242688 | * | 9/1989 |
| JP | 2005-260256 | * | 9/2005 |
| JP | 2006-041096 | * | 2/2006 |
| WO | WO 2007023439 A2 | | 3/2007 |
| WO | WO 2009119034 | * | 10/2009 |

OTHER PUBLICATIONS

Translation for JP 2006-41096, Feb. 2006.*
Derwent abstract for CN 101597494, Dec. 2009.*
International Search Report and Written Opinion of the International Searching Authority for PCT/US2011/027362;p Date of Mailing: May 5, 2011; 16 pages.
Chen, Lei et al., "Light Converting Inorganic Phosphors for White Light-Emitting Diodes," *Materials*3, (2010), pp. 2172-2195.
International Search Report and Written Opinion for PCT/US2012/040093; Date of Mailing: Jul. 30, 2012; 10 pages.

* cited by examiner

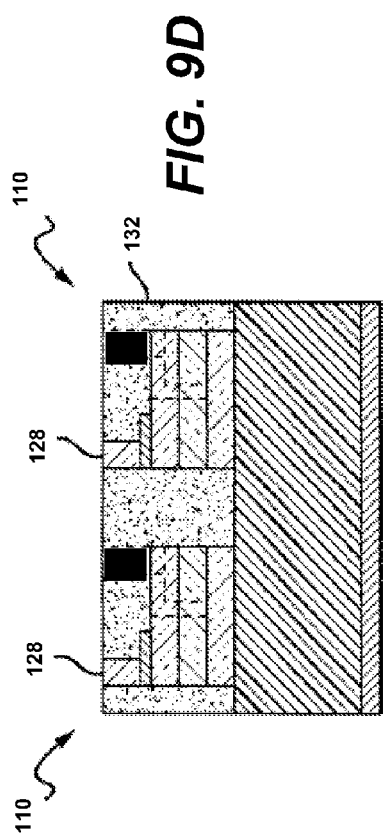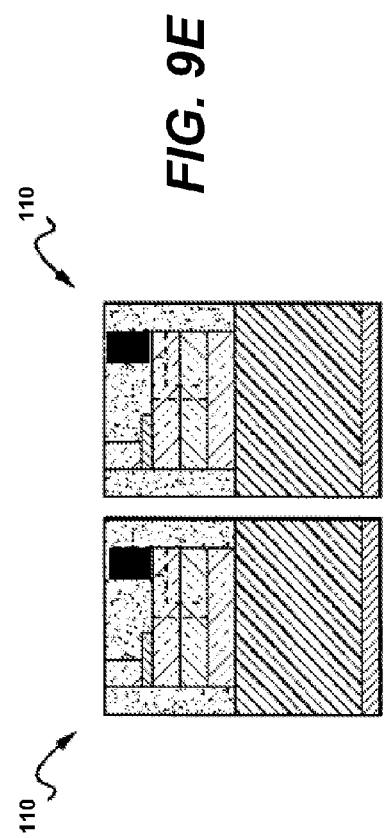

GALLIUM-SUBSTITUTED YTTRIUM ALUMINUM GARNET PHOSPHOR AND LIGHT EMITTING DEVICES INCLUDING THE SAME

FIELD OF THE INVENTION

The present invention relates to phosphor compositions and to light emitting devices that include phosphor compositions.

BACKGROUND

Light emitting diodes ("LEDs") are well known solid state lighting devices that are capable of generating light. LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor active layers are formed in these epitaxial layers. When a sufficient voltage is applied across the active layer, electrons in the n-type semiconductor layers and holes in the p-type semiconductor layers flow toward the active layer. As the electrons and holes flow toward each other, some of the electrons will "collide" with a hole and recombine. Each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

LEDs typically have a narrow wavelength distribution that is tightly centered about a "peak" wavelength (i.e., the single wavelength where the radiometric emission spectrum of the LED reaches its maximum as detected by a photo-detector). For example, the spectral power distributions of a typical LED may have a full width of, for example, about 10-30 nm, where the width is measured at half the maximum illumination (referred to as the full width half maximum or "FWHM" width). Accordingly, LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Thus, the dominant wavelength differs from the peak wavelength in that the dominant wavelength takes into account the sensitivity of the human eye to different wavelengths of light.

As most LEDs are almost monochromatic light sources that appear to emit light having a single color, LED lamps that include multiple LEDs that emit light of different colors have been used in order to provide solid state light emitting devices that generate white light. In these devices, the different colors of light emitted by the individual LED chips combine to produce a desired intensity and/or color of white light. For example, by simultaneously energizing red, green and blue light emitting LEDs, the resulting combined light may appear white, or nearly white, depending on the relative intensities of the source red, green and blue LEDs.

White light may also be produced by surrounding a single-color LED with a luminescent material that converts some of the light emitted by the LED to light of other colors. The combination of the light emitted by the single-color LED that passes through the wavelength conversion material along with the light of different colors that is emitted by the wavelength conversion material may produce a white or near-white light. For example, a single blue-emitting LED chip (e.g., made of indium gallium nitride and/or gallium nitride) may be used in combination with a yellow phosphor, polymer or dye such as for example, cerium-doped yttrium aluminum garnet (which has the chemical formula $Y_3Al_5O_{12}$:Ce, and is commonly referred to as YAG:Ce), that "down-converts" the wavelength of some of the blue light emitted by the LED, changing its color to yellow. Blue LEDs made from indium gallium nitride exhibit high efficiency (e.g., external quantum efficiency as high as 60%). In a blue LED/yellow phosphor lamp, the blue LED chip produces an emission with a dominant wavelength of about 445-470 nanometers, and the phosphor produces yellow fluorescence with a peak wavelength of about 550 nanometers in response to the blue emission. Some of the blue light passes through the phosphor (and/or between the phosphor particles) without being down-converted, while a substantial portion of the light is absorbed by the phosphor, which becomes excited and emits yellow light (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles (e.g., a $CaAlSiN_3$ ("CASN") based phosphor) may also be added to improve the color rendering properties of the light, i.e., to make the light appear more "warm," particularly when the single color LED emits blue or ultraviolet light.

As noted above, phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

LEDs are used in a host of applications including, for example, backlighting for liquid crystal displays, indicator lights, automotive headlights, flashlights, specialty lighting applications and even as replacements for conventional incandescent and/or fluorescent lighting in general lighting and illumination applications. In many of these applications, it may be desirable to provide a lighting source that generates light having specific properties.

SUMMARY

According to some embodiments of the invention, provided are phosphor compositions that include a yttrium aluminum garnet (YAG) phosphor as a primary phosphor, wherein gallium is substituted into the YAG phosphor lattice. In some embodiments, cerium is also substituted into the YAG phosphor. The addition of gallium into the YAG lattice may produce a phosphor material that obviates the need for both a yellow and a green phosphor in light emitting devices that produce warm white light, but instead provides the necessary emission in one material. Also provided according to embodiments of the invention are phosphor compositions that include $Y_aCe_bAl_cGa_dO_z$ as a primary phosphor, wherein a, b, c, d and z are positive numbers, and wherein $R=(a+b)/(c+d)$ and $0.5<R<0.7$. In some embodiments, $b/(a+b)=$mol % Ce, and $0<$mol % $Ce<10$; $d/(c+d)=$mol % Ga, and $0<$mol %

Ga<50. In addition, in some embodiments, z is nominally 12. In particular embodiments, 2<mol % Ce<4; 10<mol % Ga<30; and 0.5<R≤0.6. In some embodiments, the primary phosphor is present at a concentration in a range of 50 to 100 weight percent of the total phosphor concentration.

In some embodiments of the invention, the phosphor composition down-converts radiation having a peak wavelength in a range of 445 nm to 470 nm to radiation having a peak wavelength in a range of 500 nm to 570 nm. In some embodiments, the phosphor compositions include a secondary phosphor that down-converts radiation having a peak wavelength in a range of 445 nm to 470 nm to radiation having a peak wavelength in a range of 600 nm to 660 nm. In some embodiments, the secondary phosphor comprises a nitride and/or oxynitride phosphor. In particular embodiments, the secondary phosphor includes $(Ca_{1-x}Sr_x)SiAlN_3:Eu^{2+}$.

In some embodiments of the invention, the phosphor composition is present as particles having an average particle diameter in a range of 2 to 25 μm. In some embodiments, the phosphor composition also includes a binder.

Also provided according to some embodiments of the present invention are light emitting devices that include a solid state lighting source; and a phosphor composition according to an embodiment of the invention. In some embodiments, the phosphor composition down-converts radiation having a peak wavelength in a range of 445 nm to 470 nm to radiation having a peak wavelength in a range of 500 nm to 570 nm. In some embodiments, the phosphor compositions include a secondary phosphor that down-converts radiation having a peak wavelength in a range of 445 nm to 470 nm to radiation having a peak wavelength in a range of 600 nm to 660 nm. In some embodiments, the light emitting device includes a separate secondary phosphor composition such that the phosphor composition and the secondary phosphor composition together down-convert radiation having a peak wavelength in a range of 445 nm to 470 nm to radiation having a peak wavelength in a range of 600 nm to 660 nm. In some embodiments, the phosphor composition is present as a single crystal phosphor.

In some embodiments of the invention, the phosphor composition down-converts at least some of the radiation emitted by the solid state lighting source to a radiation having a peak wavelength greater than 580 nanometers. In some embodiments, the phosphor composition down-converts at least some of the radiation emitted by the solid state lighting source to a radiation having a peak wavelength between 530 nanometers and 585 nanometers, and at least some of the radiation emitted by the solid state lighting source to a radiation having a peak wavelength between 600 nanometers and 660 nanometers.

In some embodiments of the invention, the solid state lighting source comprises a light emitting diode that emits light having a dominant wavelength in the blue color range. In particular embodiments, the dominant wavelength of the blue LED is between about 445 nm to 470 nm.

In some embodiments, the light emitting device emits a warm white light having a correlated color temperature between about 2500K and 4500K. In some embodiments, the light emitting device emits a warm white light having a correlated color temperature between about 2500K and 3300K. In some embodiments, the light emitting device has a CRI value of at least 90. In some embodiments, the light emitted by the light emitting device has a color point that is within 7 MacAdam ellipses of the black-body locus on a 1931 CIE chromaticity diagram and has a correlated color temperature of between about 2500K and about 3300K. In addition, in some embodiments of the invention, the light emitting device has a CRI R9 component of higher than 50.

BRIEF DESCRIPTION OF THE DRAWINGS

FIGS. 9A-9E are sectional views illustrating fabrication steps that may be used to apply a phosphor composition to an LED chip wafer according to embodiments of the invention.

DETAILED DESCRIPTION OF EMBODIMENTS OF THE INVENTION

Figure 1:
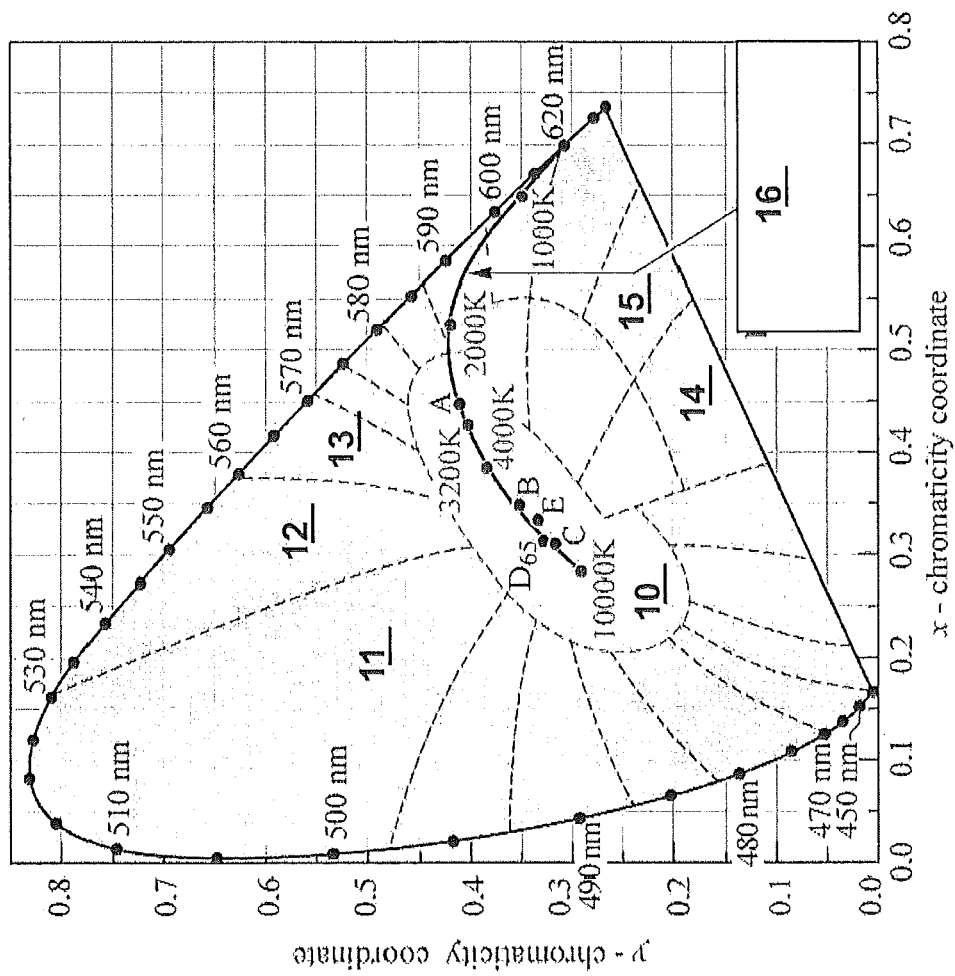
FIG. 1 is a graph of a 1931 CIE Chromaticity Diagram illustrating the location of the planckian locus.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

All patents and patent applications referred to here are incorporated by reference herein in their entirety. In case of conflicting terminology or scope, the present application is controlling.

As used herein, the term "solid state light emitting device" may include a light emitting diode, laser diode and/or other semiconductor device which includes one or more semiconductor layers, which may include silicon, silicon carbide, gallium nitride and/or other semiconductor materials, an optional substrate which may include sapphire, silicon, silicon carbide and/or other microelectronic substrates, and one or more contact layers which may include metal and/or other conductive materials. The design and fabrication of solid state light emitting devices are well known to those skilled in the art. The expression "light emitting device," as used herein, is not limited, except that it be a device that is capable of emitting light.

Solid state light emitting devices according to embodiments of the invention may include III-V nitride (e.g., gallium nitride) based LEDs or lasers fabricated on a silicon carbide or gallium nitride substrates such as those devices manufactured and sold by Cree, Inc. of Durham, N.C. Such LEDs and/or lasers may (or may not) be configured to operate such that light emission occurs through the substrate in a so-called "flip chip" orientation. Solid state light emitting devices according to embodiments of the present invention include both vertical devices with a cathode contact on one side of the chip, and an anode contact on an opposite side of the chip and devices in which both contacts are on the same side of the device. Some embodiments of the present invention may use solid state light emitting devices, device packages, fixtures, luminescent materials/elements, power supplies, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or U.S. Pat. No. 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272.

Visible light may include light having many different wavelengths. The apparent color of visible light can be illustrated with reference to a two dimensional chromaticity diagram, such as the 1931 CIE Chromaticity Diagram shown in FIG. 1. Chromaticity diagrams provide a useful reference for defining colors as weighted sums of colors.

As shown in FIG. 1, colors on a 1931 CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 10 in FIG. 1. There are many different hues of light that may be considered "white," as evidenced by the size of the region 10. For example, some "white" light, such as light generated by sodium vapor lighting devices, may appear yellowish in color, while other "white" light, such as light generated by some fluorescent lighting devices, may appear more bluish in color.

Light that generally appears green or includes a substantial green component is plotted in the regions 11, 12 and 13 that are above the white region 10, while light below the white region 10 generally appears pink, purple or magenta. For example, light plotted in regions 14 and 15 of FIG. 1 generally appears magenta (i.e., red-purple or purplish red).

It is further known that a binary combination of light from two different light sources may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer.

Each point in the graph of FIG. 1 is referred to as the "color point" of a light source that emits a light having that color. As shown in FIG. 1 a locus of color points that is referred to as the "black-body" locus 16 exists which corresponds to the location of color points of light emitted by a black-body radiator that is heated to various temperatures. The black-body locus 16 is also referred to as the "planckian" locus because the chromaticity coordinates (i.e., color points) that lie along the black-body locus obey Planck's equation: $E(\lambda)=A\lambda^{-5}/(e^{B/T}-1)$, where E is the emission intensity, $\lambda$ is the emission wavelength, T is the color temperature of the black-body and A and B are constants. Color coordinates that lie on or near the black-body locus 16 yield pleasing white light to a human observer.

As a heated object becomes incandescent, it first glows reddish, then yellowish, then white, and finally bluish, as the wavelength associated with the peak radiation of the black-body radiator becomes progressively shorter with increased temperature. This occurs because the wavelength associated with the peak radiation of the black-body radiator becomes progressively shorter with increased temperature, consistent with the Wien Displacement Law. Illuminants that produce light which is on or near the black-body locus 16 can thus be described in terms of their correlated color temperature (CCT). As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color. Warm white light is generally a pleasing color to a human observer. Warm white light with a CCT of 2500K to 3300K may be preferred for certain applications.

The ability of a light source to accurately reproduce color in illuminated objects is typically characterized using the color rendering index ("CRI"). The CRI of a light source is a modified average of the relative measurements of how the color rendition of an illumination system compares to that of a reference black-body radiator when illuminating eight reference colors. Thus, the CRI is a relative measure of the shift in surface color of an object when lit by a particular lamp. The CRI equals 100 if the color coordinates of a set of test colors being illuminated by the illumination system are the same as the coordinates of the same test colors being irradiated by the black-body radiator. Daylight generally has a CRI of nearly 100, incandescent bulbs have a CRI of about 95, fluorescent lighting typically has a CRI of about 70 to 85, while monochromatic light sources have a CRI of essentially zero. Light sources for general illumination applications with a CRI of less than 50 are generally considered very poor and are typically only used in applications where economic issues preclude other alternatives. Light sources with a CRI value between 70 and 80 have application for general illumination where the colors of objects are not important. For some general interior illumination, a CRI value of greater than 80 is acceptable. A light source with color coordinates within 4 MacAdam step ellipses of the planckian locus 16 and a CRI value that exceeds 85 is more suitable for general illumination purposes. Light sources with CRI values of more than 90 provide greater color quality.

For backlight, general illumination and various other applications, it is often desirable to provide a lighting source that generates white light having a relatively high CRI, so that objects illuminated by the lighting source may appear to have more natural coloring to the human eye. Accordingly, such lighting sources may typically include an array of solid state lighting devices including red, green and blue light emitting devices. When red, green and blue light emitting devices are energized simultaneously, the resulting combined light may appear white, or nearly white, depending on the relative intensities of the red, green and blue sources. However, even light that is a combination of red, green and blue emitters may have a low CRI, particularly if the emitters generate saturated light, because such light may lack contributions from many visible wavelengths.

According to some embodiments of the invention, provided are phosphor compositions that include a yttrium aluminum garnet (YAG) phosphor as a primary phosphor, wherein gallium is substituted into the YAG phosphor lattice. In some embodiments, cerium is also substituted into the YAG phosphor lattice. In some embodiments, other activators, such as Tb, Sm, Dy, Nd, Cr, Er, Yb, Ho and Tm, may also be included. In some embodiments of the invention, provided are phosphor compositions that include $Y_aCe_bAl_cGa_dO_z$ as a primary phosphor, wherein a, b, c, d and z are positive numbers, which may be fractional numbers or integers. In some cases, b/(a+b)=mol % Ce, and 0<mol % Ce<10 and d/(c+d) =mol % Ga and 0<mol % Ga<50. Additionally, in some embodiments, R=(a+b)/(c+d) and 0.5<R<0.7. Additionally, in some cases, z is nominally 12(+/−δ). The term "primary phosphor" means that the gallium-substituted YAG, such as $Y_aCe_bAl_cGa_dO_z$, is present in the phosphor compositions described herein. The gallium-substituted YAG phosphor may be the only phosphor in the composition, or the phosphor composition may include additional phosphors, including but not limited to the secondary phosphor described herein. Additionally, in some cases, the phosphor compositions may include two or more different gallium-substituted YAG compounds, including two or more different compounds that have the formula $Y_aCe_bAl_cGa_dO_z$, as defined above. In particular embodiments, the mol % Ce is greater than 2% but less than 4%. In particular embodiments, the mol % Ga is greater than 10% but less than 30%. Furthermore, in particular embodiments, R is greater than 0.5 and less than or equal to 0.6. In some embodiments of the invention, the phosphor compositions described herein may have a sufficiently broad FWHM bandwidth such that its FWHM emission spectra falls into at least part of the cyan color range.

In some embodiments, light emitting devices that include a phosphor composition described herein may emit warm white light having high CRI values. In some embodiments, the solid state lighting devices according to embodiments of the present invention emit light having CRI values that exceed 90 and have a color point that is within 7 MacAdam ellipses of the black-body locus on a 1931 CIE chromaticity diagram, as well as have a correlated color temperature of between about 2500K and about 4500K. In other embodiments, the solid state lighting devices may emit light having CRI values that exceed 85, in some embodiments, that exceed 88, and in some embodiments, that exceed 90, and, in some embodiments, may have a color point that is between 0.385 and 0.485 ccx and 0.380 and 0.435 ccy on the 1931 CIE chromaticity diagram and have a correlated color temperature in a range of 2500K to 4500K. In some embodiments, the correlated color temperature is in a range of 2500K and about 3300K.

Compositions described in U.S. application Ser. No. 12/720,390, filed Mar. 9, 2010, the disclosure of which is incorporated by reference herein in its entirety, may also have these desirable features. However, the compositions in U.S.

application Ser. No. 12/720,390 may include a mixture of yellow, green and red phosphors to achieve these results. The phosphor compositions described herein may obviate the need for a physical mixture of green and yellow phosphor materials, but instead the gallium-substituted YAG phosphor compositions described herein may provide the necessary emission for yellow and green phosphors in a single material. The use of a single phosphor material to replace a mixture of the yellow and green phosphor materials has the advantage of simplifying the manufacture of LED components and may also reduce the logistical burden associated with internal quality control testing that may need to be performed on different lots of phosphor material. There is also a potential for cost savings because LuAG:Ce is commonly used as a green phosphor, and Lu-containing raw materials may be more expensive than the materials needed to form gallium-substituted YAG compounds.

As described above, in some embodiments, the phosphor compositions may include a secondary phosphor that may down-convert light received from the blue LED to light having a peak wavelength in the red color range. In some embodiments, this secondary phosphor may include a nitride and/or an oxynitride phosphor. For example, $(Ca_{1-x}Sr_x)SiAlN_3:Eu^{2+}$ may be included as a secondary phosphor. In some cases, the secondary phosphor may emit light having a peak frequency between 630 nanometers and 650 nanometers and may have a FWHM of 85-95 nanometers, which is primarily in the red color range. Other red or orange phosphors that may be used as the secondary phosphor in certain embodiments include $Lu_2O_3:Eu^{3+}$; $(Sr_{2-x}La_x)(Ce_{1-x}Eu_x)O_4$; $Sr_2Ce_{1-x}Eu_xO_4$; $Sr_{2-x}Eu_xCeO_4$; $CaAlSiN_3:Eu^{2+}$ and/or $SrTiO_3:Pr^{3+}$, $Ga^{3+}$. Other examples of phosphors that may be used include $Ca_{1-x}Sr_x$-$AlSiN_3$, $Ca_2Si_5N_8$, $Sr_2Si_5N_8$, $Ba_2Si_5N_8$, $BaSi_7N_{10}$, $BaYSi_4N_7$, $Y_5(SiO_4)_3N$, $Y_4Si_2O_7N_2$, $YSiO_2N$, $Y_2Si_3O_3N_4$, $Y_2Si_3-xAl_xO_3+xN_4-x$, $Ca_{1.5}Si_9Al_3N_{16}$, $Y_{0.5}Si_9Al_3O_{1.5}N_{14.5}$, $CaSiN_2$, $Y_2Si_4N_6C$, and/or $Y_6Si_{11}N_{20}O$. Such materials may include an activator material including at least one of Ce, Eu, Sm, Yb, Gd and/or Tb.

In some embodiments, the primary phosphor is present at a concentration in a range of 50 to 100 weight percent of the total phosphor in the phosphor composition. In particular embodiments, the primary phosphor is present at a concentration in a range of 60 to 80 weight percent of the total phosphor in the phosphor composition. The secondary phosphor may include one type of phosphor or may include two or more different phosphors that down-convert light received from the blue LED to light having a peak wavelength in the red color range. Furthermore, in some embodiments, there may be additional phosphors or other luminophoric compounds in the phosphor compositions described herein. The secondary phosphor, as well as other phosphor materials, may also be included as separate compositions (i.e., not mixed with the gallium-substituted YAG, but present in another part of the device) for use in light emitting devices according to embodiments of the invention.

Figure 2:
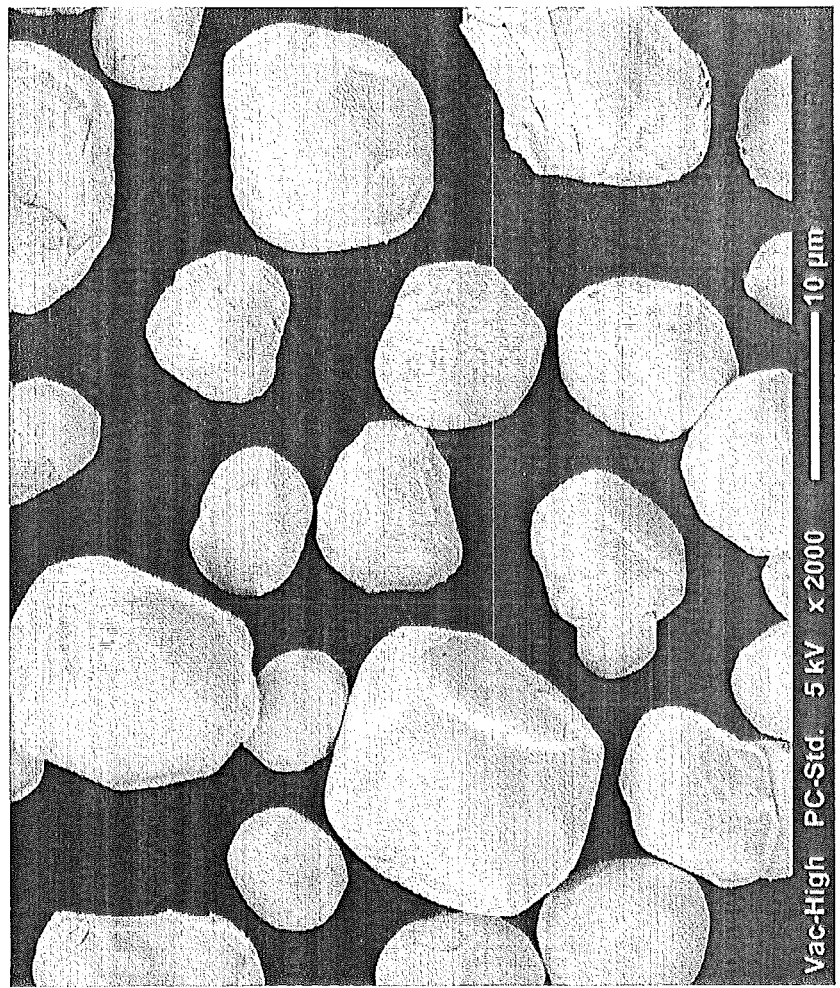
FIG. 2 is a scanning electron microscopy image of particles formed from a phosphor composition according to an embodiment of the invention.
Figure 3:
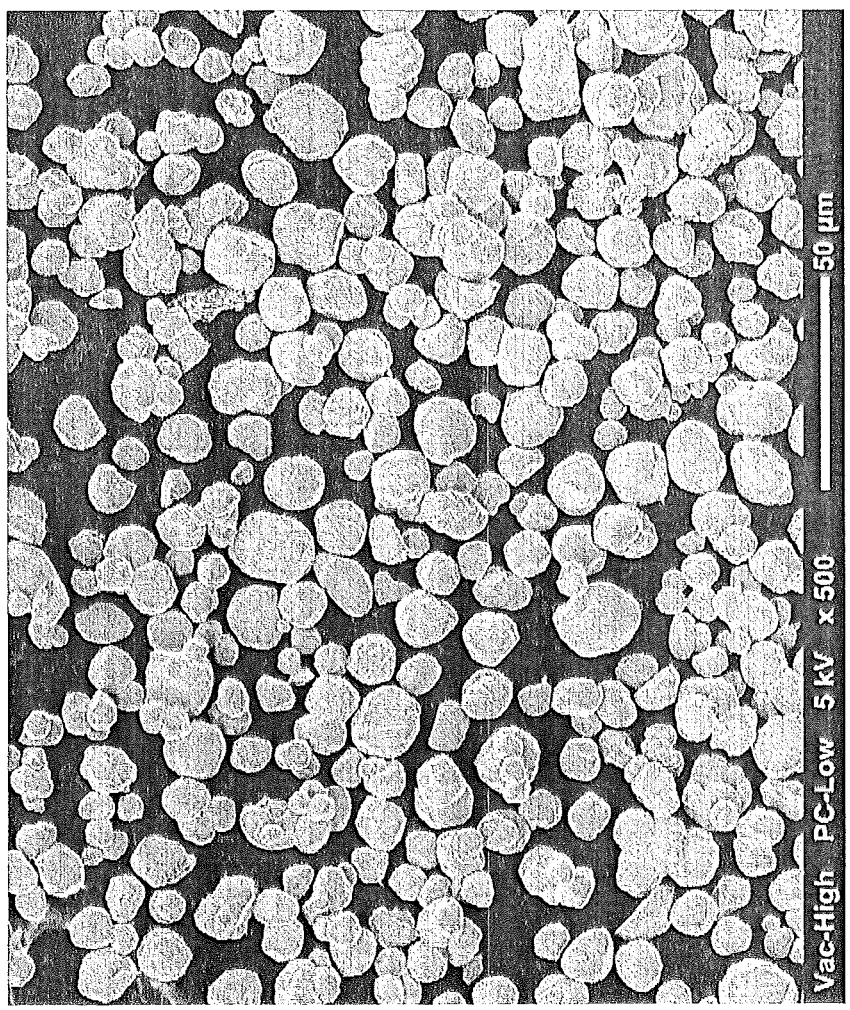
FIG. 3 is a scanning electron microscopy image of particles formed from a phosphor composition according to an embodiment of the invention.

In some embodiments of the invention, the phosphor compositions may be present in particulate form. Any suitable particle size may be used. The phosphor particles may range in diameter (the term "diameter" refers to the longest distance across the particle for non-spherical particles) and in some embodiments, the average particle size is in a range of 2 to 25 μm. However, in some embodiments, the phosphor compositions may have average particle sizes ranging from 10 nm to 100 μm sized particles, or larger. An example of particle size and morphology of a composition according to an embodiment of the invention is shown in FIGS. 2 and 3, which show a phosphor composition according to an embodiment of the invention at two different magnifications. In some embodiments, the phosphor composition may not be present as particles. For example, the primary and/or secondary phosphor may be included in a device described herein as a single crystal phosphor, such as those formed by the methods described in U.S. application Ser. No. 11/749,258, published as U.S. Publication No. 2008/0283864.

Also provided according to embodiments of the present invention are light emitting devices that include a solid state lighting source and a phosphor composition described herein. In some embodiments of the invention, the solid state lighting source comprises a light emitting diode that emits light having a dominant wavelength in the blue color range. For example, in some embodiments, the dominant wavelength of the blue LED is between about 445 nm to 470 nm.

Light emitting devices according to some embodiments of the invention may emit radiation having a peak wavelength greater than 580 nanometers. In particular embodiments, the devices may emit light having a peak wavelength in a range of 600 nm to 660 nm. In some embodiments, the device down-converts at least some of the radiation emitted by the solid state lighting source to a radiation having a peak wavelength between 530 nanometers and 585 nanometers, and at least some of the radiation emitted by the solid state lighting source to a radiation having a peak wavelength between 600 nanometers and 660 nanometers.

In some embodiments of the invention, the phosphor compositions may be tuned by changing the concentration of the cerium and gallium in the phosphor. The variation in the values for b and d in $Y_aCe_bAl_cGa_dO_z$ may vary the color of light that is emitted by the device when the phosphor is excited by blue light. As a result, the brightness, CRI, and other optical properties of the device components that contain these phosphors can be tuned or optimized through changes in composition.

Figure 4:
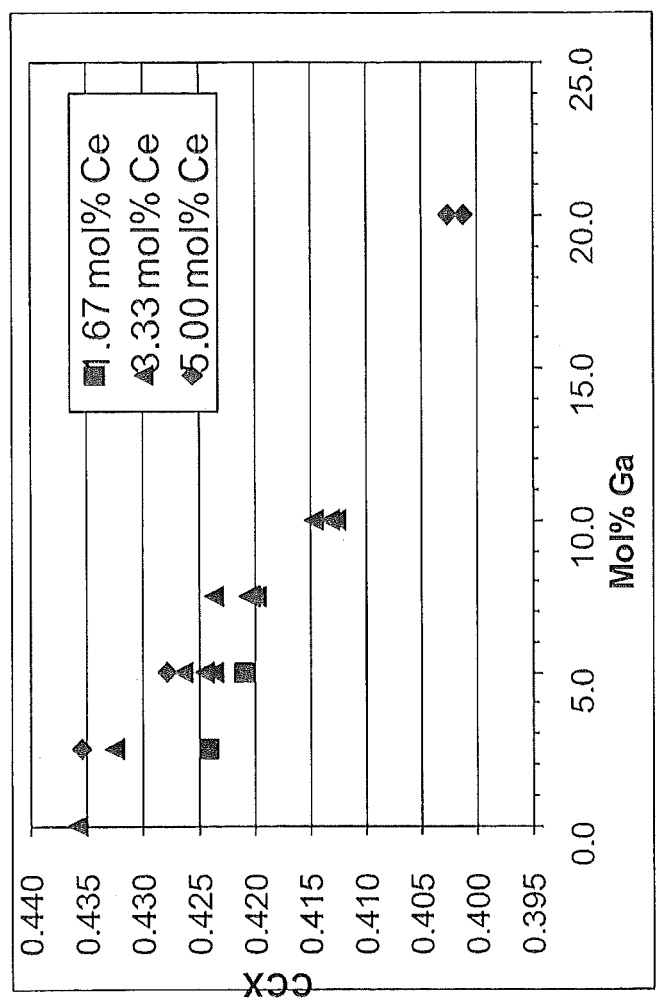
FIG. 4 is a graph illustrating the effect of Ga and Ce concentration for phosphor compositions according to embodiments of the invention on the ccx coordinates of the photoluminescence spectrum, upon excitation at 450 nm.
Figure 5:
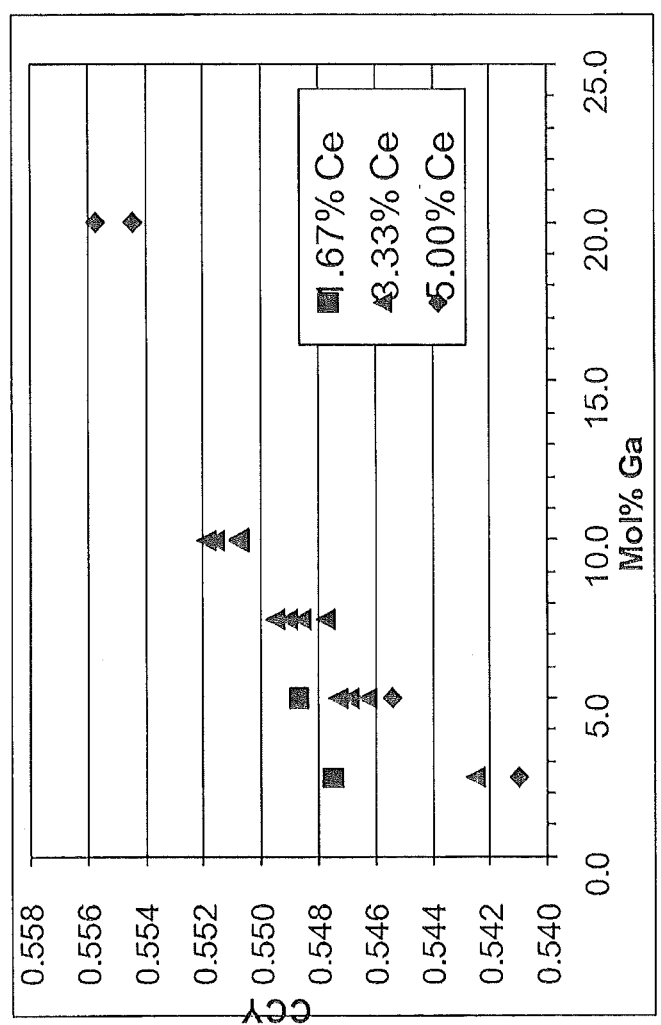
FIG. 5 is a graph illustrating the effect of Ga and Ce concentration for phosphor compositions according to embodiments of the invention on the ccy coordinates of the photoluminescence spectrum, upon excitation at 450 nm.

Referring to FIGS. 4-7, compositions according to embodiments of the invention may provide equivalent color points as a mixture of yellow and green phosphors (YAG:Ce and LuAG:Ce, respectively). In addition, the color point can be varied by varying the gallium and cerium concentrations in the phosphor. Referring to FIGS. 4 and 5, the variation of the gallium concentration at several different cerium concentrations in $Y_aCe_bAl_cGa_dO_z$ affects the ccx and ccy coordinates of the photoluminescence spectrum upon excitation with 450 nm radiation. In this case, the ccx coordinates decrease as the gallium concentration increases at a particular cerium concentration (FIG. 4), and the ccy coordinates increase as the gallium concentration increases at a specific cerium concentration (FIG. 5). On the other hand, increasing the cerium concentration at a fixed gallium concentration increases the ccx coordinate (FIG. 4) and decreases the ccy coordinate (FIG. 5). It is clear from these figures that changes in the cerium and gallium concentrations can be used to adjust the color coordinates of the photoluminescence spectrum through a wide range of ccx and ccy values. It is also possible to use the relationships in these graphs to predict the color coordinates of a variety of compositions, and thus one can deterministically choose compositions to achieve specific desired color coordinates. In some embodiments of the invention, the gallium is present in $Y_aCe_bAl_cGa_dO_z$ at a concentration in a range of greater than 0 but less than 50 mol %, in some embodiments, is greater than 0 but less than 20 mol %, in some embodiments, is greater than 5 but less than 20 mol %, and in some embodiments, greater than 10 but less than 30 mol %. Additionally, in some embodiments, the cerium is present in the composition at a concentration greater than 0 but less than 10 mol %, and in some embodiments, greater than 2 but less than 5 mol %.

Figure 6:
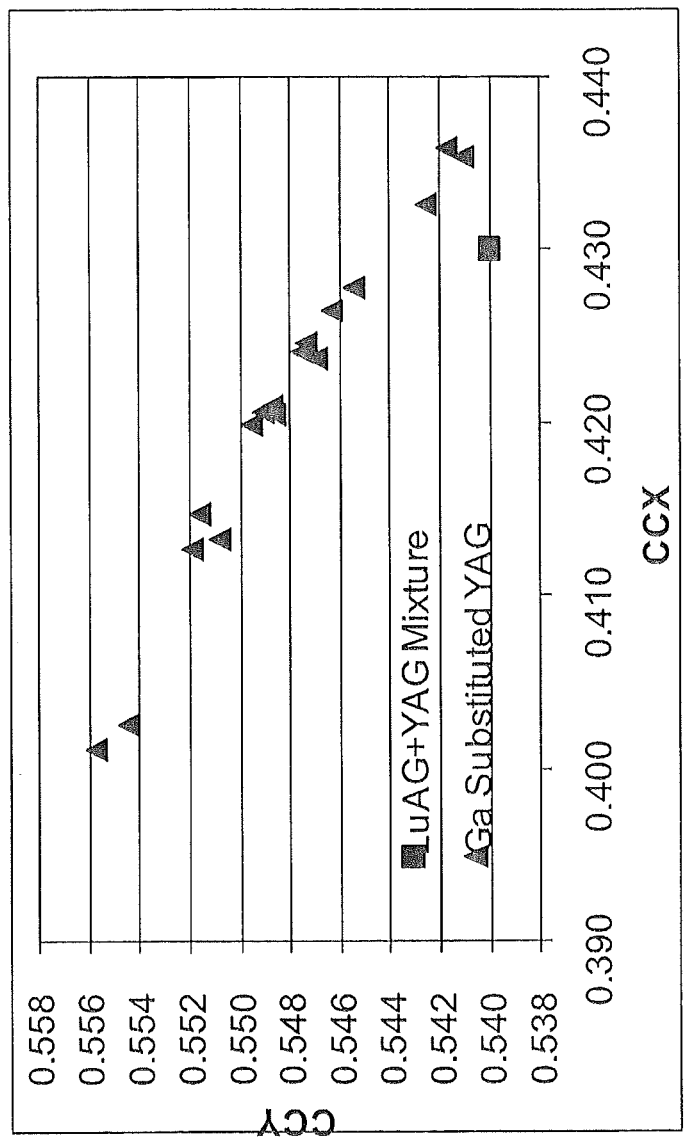
FIG. 6 is a graph illustrating representative color coordinates of the photoluminescence spectrum for different phosphor compositions according to embodiments of the invention, upon excitation at 450 nm. The color point of a 50:50 mixture of LuAG:Ce/YAG:Ce is also shown for comparison.

FIG. 6 compares the color point of the photoluminescence spectrum (450 nm excitation) of a 50:50 physical mixture of LuAG:Ce/YAG:Ce with the color points of $Y_aCe_bAl_cGa_dO_z$ at several specific gallium and cerium concentrations. As shown in FIG. 6, the $Y_aCe_bAl_cGa_dO_z$ compositions can achieve similar ccx and ccy coordinates to the 50:50 physical mixture of LuAG:Ce/YAG:Ce. In this example, the ccx coordinates of the photoluminescence spectrum of $Y_aCe_bAl_cGa_dO_z$ compositions are in a range of 0.400 to 0.440 and the ccy coordinates are in a range of 0.540 and 0.556.

Figure 7:
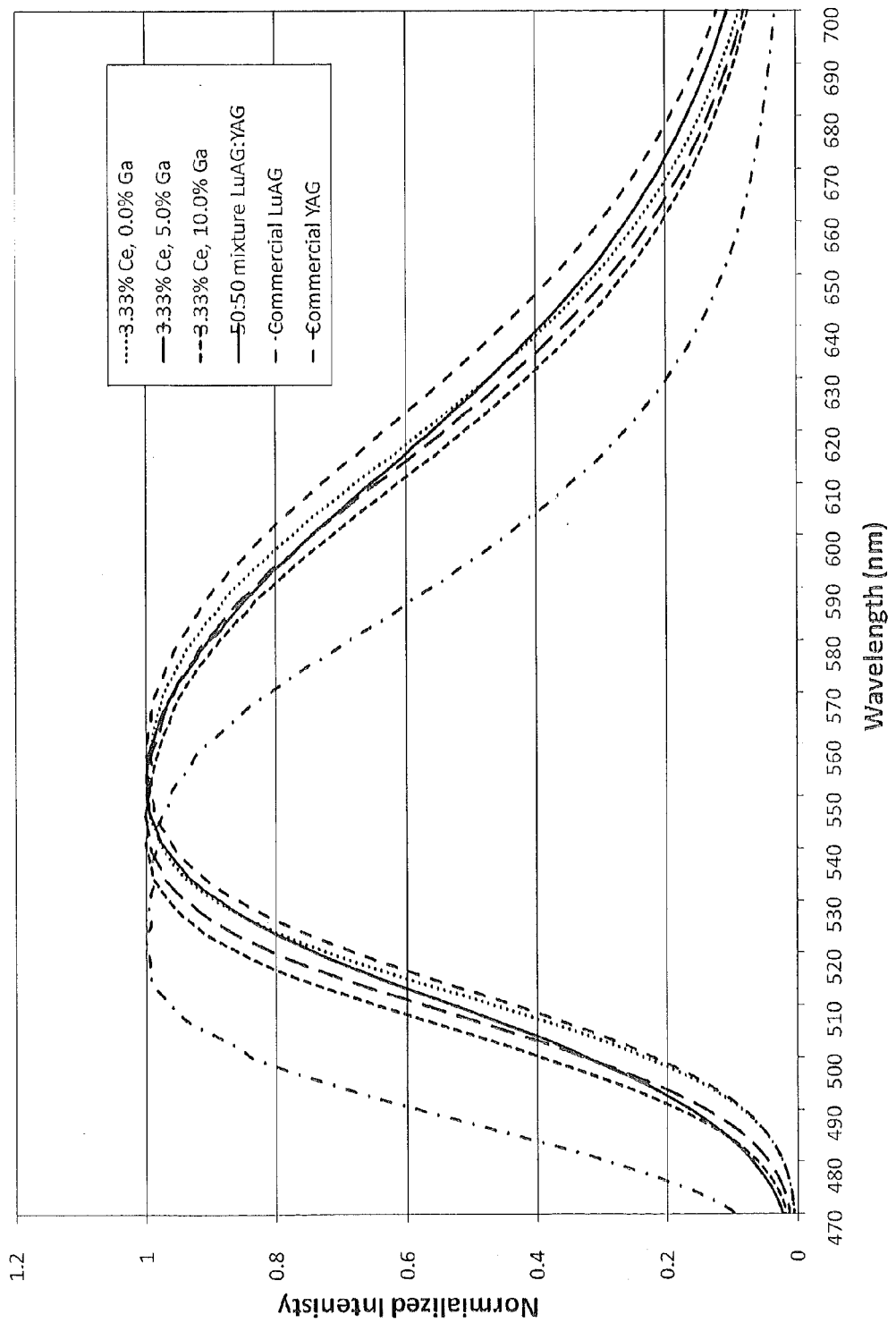
FIG. 7 shows photoluminescence spectra of phosphor compositions according to embodiments of the invention. The spectra for commercial LuAG:Ce, commercial YAG:Ce and a 50:50 mixture of LuAG:Ce/YAG:Ce are also shown for comparison.

FIG. 7 provides the photoluminescence emission spectra of the $Y_aCe_bAl_cGa_dO_z$ phosphors for several different gallium and cerium concentrations. The peak wavelength is decreased as more gallium is added. These spectra overlap with the emission spectra of a 50:50 physical mixture of LuAG:Ce/YAG:Ce, as shown in FIG. 7. These spectra are generally shifted to the left (lower wavelengths) of YAG:Ce, and they are shifted to the right (higher wavelengths) of LuAG:Ce.

Figure 8A:
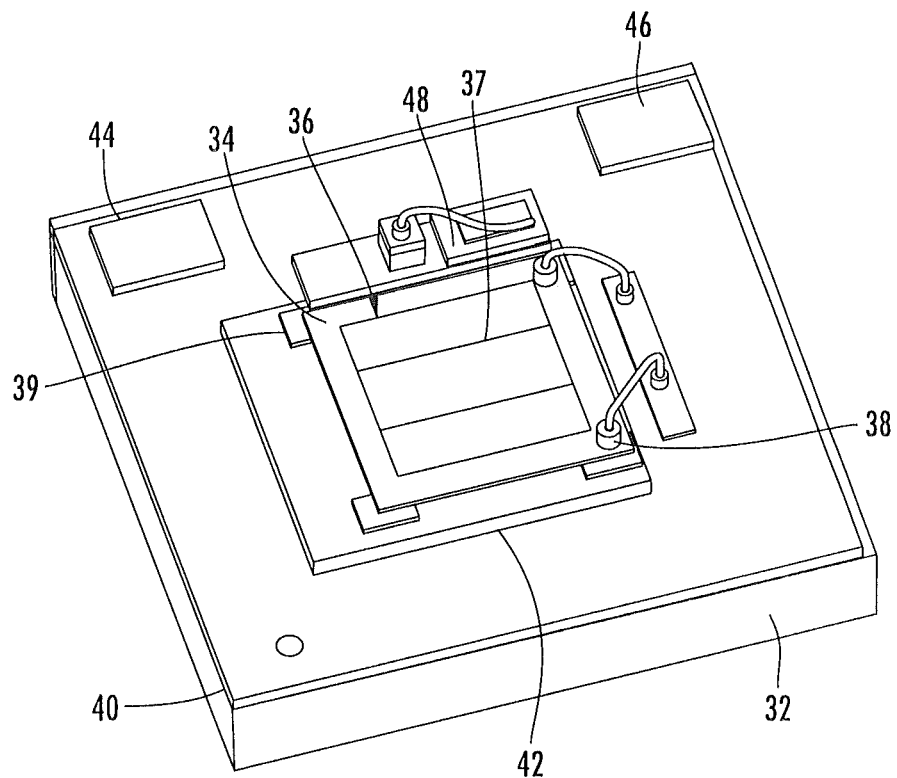
FIGS. 8A-8D are various views of a solid state light emitting device according to embodiments of the present invention.
Figure 8B:
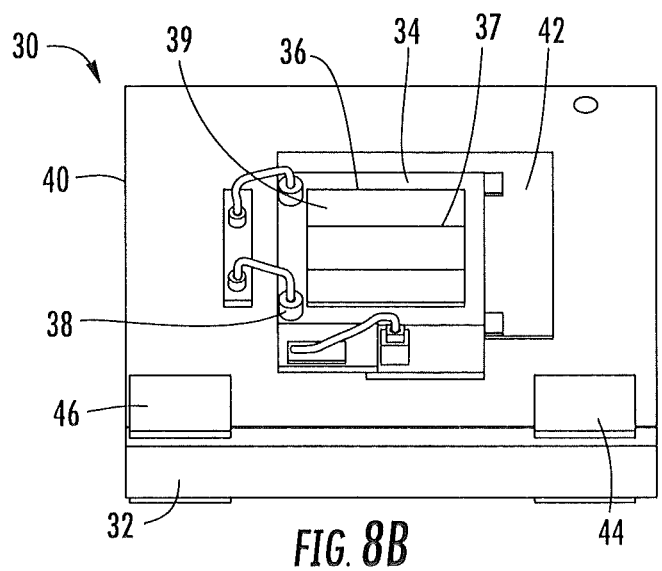
Figure 8C:
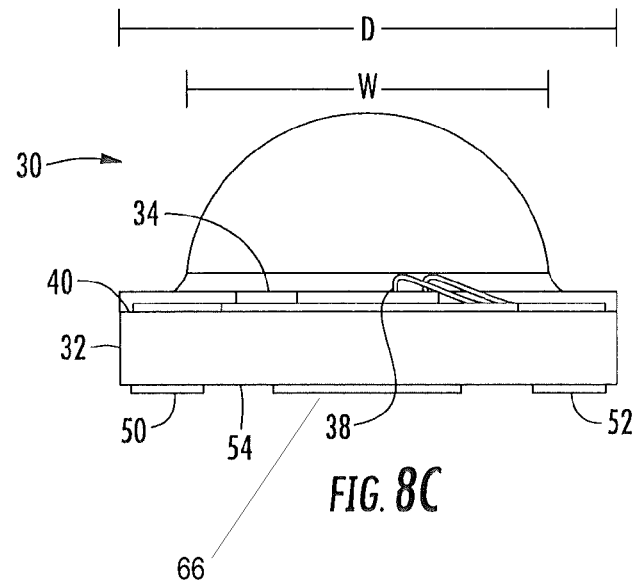
Figure 8D:
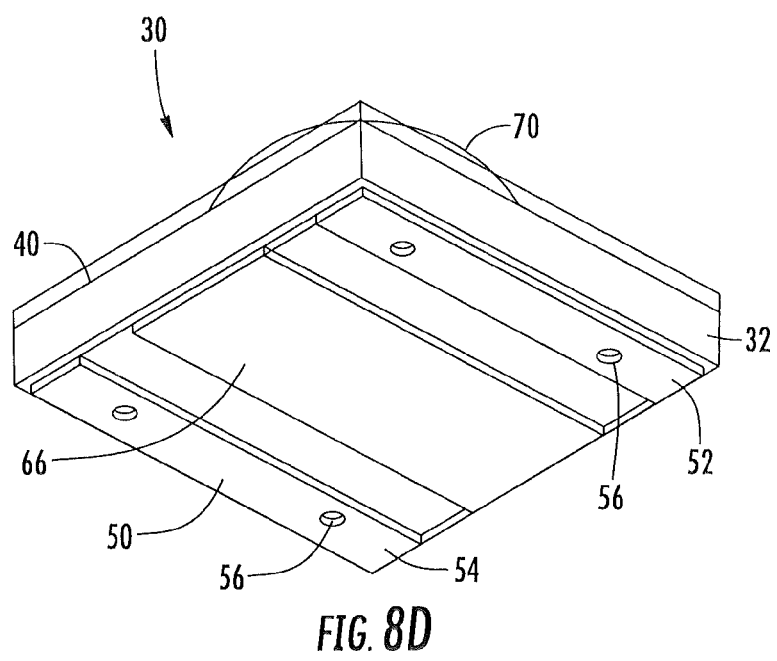

A solid state light emitting device 30 will now be described that includes a phosphor composition according to embodiments of the present invention with reference to FIGS. 8A-8D. The solid state light emitting device 30 comprises a packaged LED. In particular, FIG. 8A is a perspective view of the solid state light emitting device 30 without a lens thereof. FIG. 8B is a perspective view of the device 30 viewed from the opposite side. FIG. 8C is a side view of the device 30 with a lens covering the LED chip. FIG. 8D is a bottom perspective view of the device 30.

As shown in FIG. 8A, the solid state light emitting device 30 includes a substrate/submount ("submount") 32 on which a single LED chip or "die" 34 is mounted. The submount 32 can be formed of many different materials such as, for example, aluminum oxide, aluminum nitride, organic insulators, a printed circuit board (PCB), sapphire or silicon. The LED 34 can have many different semiconductor layers arranged in different ways. LED structures and their fabrication and operation are generally known in the art and hence are only briefly discussed herein. The layers of the LED 34 can be fabricated using known processes such as, for example, metal organic chemical vapor deposition (MOCVD). The layers of the LED 34 may include at least one active layer/region sandwiched between first and second oppositely doped epitaxial layers all of which are formed successively on a growth substrate. Typically, many LEDs are grown on a growth substrate such as, for example, a sapphire, silicon carbide, aluminum nitride (AlN), or gallium nitride (GaN) substrate to provide a grown semiconductor wafer, and this wafer may then be singulated into individual LED dies, which are mounted in a package to provide individual packaged LEDs. The growth substrate can remain as part of the final singulated LED or, alternatively, the growth substrate can be fully or partially removed. In embodiments where the growth substrate remains, it can be shaped and/or textured to enhance light extraction.

It is also understood that additional layers and elements can also be included in the LED 34, including but not limited to buffer, nucleation, contact and current spreading layers as well as light extraction layers and elements. It is also understood that the oppositely doped layers can comprise multiple layers and sub-layers, as well as super lattice structures and interlayers. The active region can comprise, for example, a single quantum well (SQW), multiple quantum well (MQW), double heterostructure or super lattice structure. The active region and doped layers may be fabricated from different material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

The LED 34 may be an ultraviolet, violet or blue LED that emits radiation with a dominant wavelength in a range of about 380 to about 470 nm.

The LED 34 may include a conductive current spreading structure 36 on its top surface, as well as one or more contacts 38 that are accessible at its top surface for wire bonding. The spreading structure 36 and contacts 38 can both be made of a conductive material such as Au, Cu, Ni, In, Al, Ag or combinations thereof, conducting oxides and transparent conducting oxides. The current spreading structure 36 may comprise conductive fingers 37 that are arranged in a pattern on the LED 34 with the fingers spaced to enhance current spreading from the contacts 38 into the top surface of the LED 34. In operation, an electrical signal is applied to the contacts 38 through a wire bond as described below, and the electrical signal spreads through the fingers 37 of the current spreading structure 36 into the LED 34. Current spreading structures are often used in LEDs where the top surface is p-type, but can also be used for n-type materials.

The LED 34 may be coated with a phosphor composition 39 according to embodiments of the present invention. It will be understood that the phosphor composition 39 may comprise any of the phosphor compositions discussed in the present disclosure.

The phosphor composition 39 may be coated on the LED 34 using many different methods, with suitable methods being described in U.S. patent application Ser. Nos. 11/656,759 and 11/899,790, both entitled Wafer Level Phosphor Coating Method and Devices Fabricated Utilizing Method. Alternatively the phosphor composition 39 may be coated on the LED 34 using other methods such an electrophoretic deposition (EPD), with a suitable EPD method described in U.S. patent application Ser. No. 11/473,089 entitled Close Loop Electrophoretic Deposition of Semiconductor Devices. One exemplary method of coating the phosphor composition 39 onto the LED 34 is described herein with reference to FIGS. 9A-9E.

An optical element or lens 70 (see FIGS. 8C-8D) is formed on the top surface 40 of the submount 32, over the LED 34, to provide both environmental and/or mechanical protection. The lens 70 can be molded using different molding techniques such as those described in U.S. patent application Ser. No. 11/982,275 entitled Light Emitting Diode Package and Method for Fabricating Same. The lens 70 can be many different shapes such as, for example, hemispheric. Many different materials can be used for the lens 70 such as silicones, plastics, epoxies or glass. The lens 70 can also be textured to improve light extraction and/or scattering particles. In some embodiments, the lens 70 may comprise the phosphor composition 39 and/or may be used to hold a phosphor composition 39 in place over the LED 34 instead of and/or in addition to coating a phosphor composition 39 directly onto the LED chip 34.

The solid state light emitting device 30 may comprise an LED package having different sizes or footprints. In some embodiments, the surface area of the LED chip 34 may cover more than 10% or even 15% of the surface area of the submount 32. In some embodiments, the ratio of the width W of the LED chip 34 to the diameter D (or width D, for square lens) of the lens 70 may be greater than 0.5. For example, in some embodiments, the solid state light emitting device 30 may comprise an LED package having a submount 32 that is approximately 3.45 mm square and a hemispherical lens having a maximum diameter of approximately 2.55 mm. The LED package may be arranged to hold an LED chip that is approximately 1.4 mm square. In this embodiment, the surface area of the LED chip 34 covers more than 16% of the surface area of the submount 32.

The top surface 40 of the submount 32 may have patterned conductive features that can include a die attach pad 42 with an integral first contact pad 44. A second contact pad 46 is also included on the top surface 40 of the submount 32 with the LED 34 mounted approximately at the center of the attach pad 42. The attach pad 42 and first and second contact pads 44, 46 may comprise metals or other conductive materials such as, for example, copper. The copper pads 42, 44, 46 may be plated onto a copper seed layer that is, in turn, formed on a titanium adhesion layer. The pads 42, 44, 46 may be patterned using standard lithographic processes. These patterned conductive features provide conductive paths for electrical connection to the LED 34 using known contacting methods. The LED 34 can be mounted to the attach pad 42 using known methods and materials.

A gap 48 (see FIG. 8A) is included between the second contact pad 46 and the attach pad 42 down to the surface of the submount 32. An electrical signal is applied to the LED 34 through the second pad 46 and the first pad 44, with the electrical signal on the first pad 44 passing directly to the LED 34 through the attach pad 42 and the signal from the second pad 46 passing into the LED 34 through wire bonds. The gap 48 provides electrical isolation between the second pad 46 and attach pad 42 to prevent shorting of the signal applied to the LED 34.

Referring to FIGS. 8C and 8D, an electrical signal can be applied to the package 30 by providing external electrical contact to the first and second contact pads 44, 46 via first and second surface mount pads 50, 52 that are formed on the back surface 54 of the submount 32 to be at least partially in alignment with the first and second contact pads 44, 46, respectfully. Electrically conductive vias 56 are formed through the submount 32 between the first mounting pad 50 and the first contact pad 44, such that a signal that is applied to the first mounting pad 50 is conducted to first contact pad 44. Similarly, conductive vias 56 are formed between the second mounting pad 52 and second contact pad 46 to conduct an electrical signal between the two. The first and second mounting pads 50, 52 allow for surface mounting of the LED package 30 with the electrical signal to be applied to the LED 34 applied across the first and second mounting pads 50, 52.

The pads 42, 44, 46 provide extending thermally conductive paths to conduct heat away from the LED 34. The attach pad 42 covers more of the surface of the submount 32 than the LED 34, with the attach pad extending from the edges of the LED 34 toward the edges of the submount 32. The contact pads 44, 46 also cover the surface of the submount 32 between the vias 56 and the edges of the submount 32. By extending the pads 42, 44, 46, the heat spreading from the LED 34 may be improved, which may improve the operating life of the LED and/or allow for higher operating power.

The LED package 30 further comprises a metalized area 66 on the back surface 54 of the submount 32, between the first and second mounting pads 50, 52. The metalized area 66 may be made of a heat conductive material and may be in at least partial vertical alignment with the LED 34. In some embodiments, the metalized area 66 is not in electrical contact with the elements on top surface of the submount 32 or the first and second mounting pads 50, 52 on the back surface of the submount 32. Although heat from the LED is spread over the top surface 40 of the submount 32 by the attach pad 42 and the pads 44, 46, more heat will pass into the submount 32 directly below and around the LED 34. The metalized area 66 can assist with this dissipation by allowing this heat to spread into the metalized area 66 where it can dissipate more readily. The heat can also conduct from the top surface 40 of the submount 32, through the vias 56, where the heat can spread into the first and second mounting pads 50, 52 where it can also dissipate.

It will be appreciated that FIGS. 8A-8D illustrate one exemplary packaged LED that may include phosphor compositions according to embodiments of the present invention. Additional exemplary packaged LEDs are disclosed in, for example, U.S. patent application Ser. No. 12/757,891, filed Apr. 9, 2010, the entire contents of which are incorporated by reference herein as if set forth in its entirety. It will likewise be appreciated that the phosphor compositions according to embodiments of the present invention may be used with any other packaged LED structures. For example, in some embodiments, an LED device according to an embodiment of the invention may be utilized in combination with another LED, such as a red LED, including those LEDs that include diodes and/or phosphors described herein. The combination of the LED device according to an embodiment of the invention and the additional LED may provide the desired ccx and ccy coordinates, and may also have a desirably high CRI.

As noted above, in some embodiments, the phosphor compositions according to embodiments of the present invention may be directly coated onto a surface of a semiconductor wafer before the wafer is singulated into individual LED chips. One such process for applying the phosphor composition will now be discussed with respect to FIGS. 9A-9E. In the example of FIGS. 9A-9E, the phosphor composition is coated onto a plurality of LED chips 110. In this embodiment, each LED chip 110 is a vertically-structured device that has a top contact 124 and a bottom contact 122.

Figure 9A:
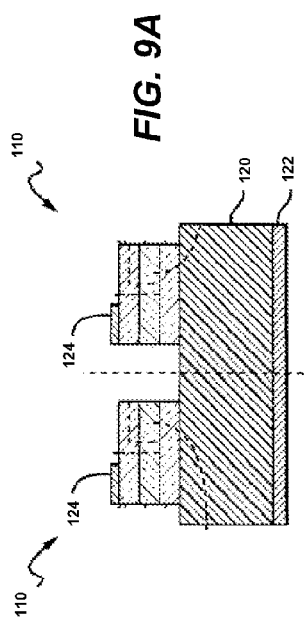

Referring to FIG. 9A, a plurality of LED chips 110 (only two are shown) are shown at a wafer level of their fabrication process (i.e., before the wafer has been separated/singulated into individual LED chips). Each of the LED chips 110 comprises a semiconductor LED that is formed on a substrate 120. Each of the LED chips 110 has first and second contacts 122, 124. The first contact 122 is on the bottom of the substrate 120 and the second contact 124 is on the top of the LED chip 110. In this particular embodiment, the top contact 124 is a p-type contact and the contact 122 on the bottom of the substrate 120 is an n-type contact. However, it will be appreciated that in other embodiments, the contacts 122, 124 may be arranged differently. For example, in some embodiments, both the contact 122 and the contact 124 may be formed on an upper surface of the LED chip 110.

Figure 9B:
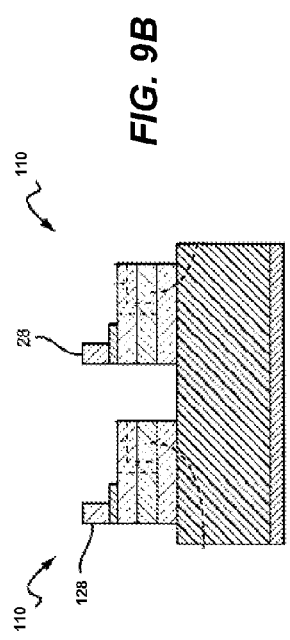

As shown in FIG. 9B, a conductive contact pedestal 128 is formed on the top contact 124 that is utilized to make electrical contact to the p-type contact 124 after the LED chips 110 are coated with a phosphor composition. The pedestal 128 can be formed of many different electrically conductive materials and can be formed using many different known physical or chemical deposition processes such as electroplating, mask deposition (e-beam, sputtering), electroless plating, or stud bumping. The height of the pedestal 128 can vary depending on the desired thickness of the phosphor composition and should be high enough to match or extend above the top surface of the phosphor composition coating from the LED.

Figure 9C:
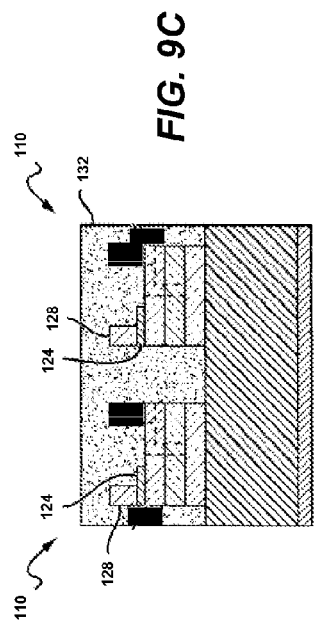

As shown in FIG. 9C, the wafer is blanketed by a phosphor composition coating 132 that covers each of the LED chips 110, the contacts 122, and the pedestal 128. The phosphor composition coating 132 may comprise a binder and a phosphor composition according to an embodiment of the invention. The material used for the binder may be a material that is robust after curing and substantially transparent in the visible wavelength spectrum such as, for example, a silicone, epoxy, glass, inorganic glass, spin-on glass, dielectrics, BCB, polymides, polymers and the like. The phosphor composition coating 132 can be applied using different processes such as spin coating, dispensing, electrophoretic deposition, electrostatic deposition, printing, jet printing or screen printing. Yet another suitable coating technique is disclosed in U.S. patent application Ser. No. 12/717,048, filed Mar. 3, 2010, the contents of which are incorporated herein by reference. The phosphor composition coating 132 can then be cured using an appropriate curing method (e.g., heat, ultraviolet (UV), infrared (IR) or air curing).

Different factors determine the amount of LED light that will be absorbed by the phosphor composition coating 132 in the final LED chips 110, including but not limited to the size of the phosphor particles, the percentage of phosphor loading, the type of binder material, the efficiency of the match between the type of phosphor and wavelength of emitted light, and the thickness of the phosphor composition coating 132. It will be understood that many other phosphors can used alone or in combination to achieve the desired combined spectral output.

Different sized phosphor particles can be used including, but not limited to, average particle sizes ranging from 10 nm to 100 µm sized particles, or larger. Smaller particle sizes typically scatter and mix colors better than larger sized particles to provide a more uniform light. Larger particles are typically more efficient at converting light compared to smaller particles, but emit a less uniform light. In some embodiments, the average particle size is in a range of 2 to 25 µm. Different sized phosphors can be included in the phosphor composition coating 132 as desired before it is applied such that the end coating 132 can have the desired combination of smaller sizes to effectively scatter and mix the light, and larger sizes to efficiently convert the light.

The coating 132 can also have different concentrations or loading of phosphor materials in the binder, with a typical concentration being in range of 30-90% by weight. In some embodiments, the phosphor concentration is in a range of 60 to 80% by weight, and is may be generally uniformly dispersed throughout the binder. In other embodiments the coating 132 can comprise multiple layers of different concentrations or types of phosphors, and the multiple layers can comprise different binder materials. One or more of the layers can be provided without phosphors. For example, a first coat of clear silicone can be deposited followed by phosphor loaded layers. As another example, the coating may comprise, for example, a two layer coating that includes a first layer having a primary phosphor on the LED chips 110, and a second layer having a secondary phosphor with a peak wavelength in the red color range directly on the primary phosphor. Numerous other layer structures are possible, including multi-layers that include multiple phosphors in the same layer, and intervening layers or elements could also be provided between layers and/or between the coating and the underlying LED chips 110.

After the initial coating of the LED chips 110 with the phosphor composition coating 132, further processing is needed to expose the pedestal 128. Referring now the FIG. 9D, the coating 132 is thinned or planarized to expose the pedestals 128 through the top surface of the coating 132. The thinning process exposes the pedestals 128, planarizes the coating 132 and allows for control of the final thickness of the coating 132. Based on the operating characteristics of the LEDs 110 across the wafer and the properties of the phosphor (or fluorescent) material selected, the end thickness of the coating 132 can be calculated to reach a desired color point/range and still expose the pedestals 128. The thickness of the coating 132 can be uniform or non-uniform across the wafer. Any suitable coating thickness may be used, including, but not limited to, less than 1 mm, less than 100 microns, less than 10 microns and less than 1 microns.

As shown in FIG. 9E, after the coating 132 is applied, the individual LED chips 110 can be singulated from the wafer using known methods such as dicing, scribe and breaking, or etching. The singulating process separates each of the LED chips 110 with each having substantially the same thickness of coating 132, and as a result, substantially the same amount of phosphor and thus substantially the same emission characteristics. Following singulation of the LED chips 110, a layer of coating 132 remains on the side surfaces of the LEDs 110 and light emitting from the side surfaces of the LEDs 110 also passes through the coating 132 and its phosphor particles. This results in conversion of at least some of the side emitting light, which can provide LED chips 110 having more consistent light emitting characteristics at different viewing angles.

Following singulation, the LED chips 110 can be mounted in a package, or to a submount or printed circuit board (PCB) without the need for further processing to add phosphor. In one embodiment the package/submount/PCB can have conventional package leads with the pedestals 128 electrically connected to the leads. A conventional encapsulation can then surround the LED chip 110 and electrical connections.

While the above coating process provides one exemplary method of fabricating the solid state light emitting devices according to embodiments of the present invention that include an LED and a phosphor composition, it will be appreciated that numerous other fabrication methods are available. For example, U.S. patent application Ser. No. 11/899,790, filed Sep. 7, 2007 (U.S. Patent Application Publication No. 2008/0179611), the entire contents of which are incorporated herein by reference, discloses various additional methods of coating a phosphor composition coating onto a solid state light emitting device. In still other embodiments, light emitting devices an LED chip that may be mounted on a reflective cup by means of a solder bond or conductive epoxy, and the phosphor composition may comprise an encapsulant material such as, for example, silicone that has the phosphors suspended therein. This phosphor composition may be used, for example, to partially or completely fill the reflective cup.

It is understood that although the present invention has been described with respect to LEDs having vertical geometries, it may also be applied to LEDs having other geometries such as, for example, to lateral LEDs that have both contacts on the same side of the LED chip.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While embodiments of the present invention have primarily been discussed above with respect to solid state light emitting devices that include LEDs, it will be appreciated that according to further embodiments of the present invention, laser diodes and/or other solid state lighting devices may be provided that include the phosphor compositions discussed above. Thus, it will be appreciated that embodiments of the present invention are not limited to LEDs, but may include other solid state lighting devices such as laser diodes.

EXAMPLES

Example Composition 1

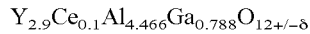

This material was synthesized through the direct reaction of the constituent oxides: $Y_2O_3$, $CeO_2$, $Al_2O_3$ and $Ga_2O_3$. The reactants were weighed out to yield: $Y_{2.9}Ce_{0.1}Al_{4.466}Ga_{0.788}O_{12+/-\delta}$. (3.33 mol % Ce, 15 mol % Ga, R=0.57). $BaF_2$ was added such that it made up 10 wt % of the total mixture. The components were well mixed. The mixture was then placed in a crucible and heated to between 1450-1650° C. for 0-12 hours in a slightly reducing atmosphere. After firing, the sample was crushed, milled, and sieved using standard methods. The Ga substituted YAG:Ce powder was mixed with $(Ca_{1-x}Sr_x)SiAlN_3$:$Eu^{3+}$ powder with a ratio chosen to produce devices with warm white color as described below.

Example Composition 2

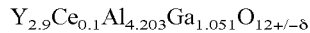

The material was synthesized in the same manner as described for example composition 1, but with the stoichiometry $Y_{2.9}Ce_{0.1}Al_{4.203}Ga_{1.051}O_{12+/-\delta}$ (3.33 mol % Ce, 20 mol % Ga, R=0.57). The Ga substituted YAG:Ce powder was mixed with the same $(Ca_{1-x}Sr_x)SiAlN_3$:$Eu^{3+}$ powder used in example composition 1 with a ratio chosen to produce devices with warm white color as described below.

Reference Composition

A physical mixture of YAG:Ce, LuAG:Ce, and the same $(Ca_{1-x}Sr_x)SiAlN_3$:$Eu^{3+}$ used for example composition 1 was made with ratios chosen to produce devices with warm white color as described below.

Figure 10A:
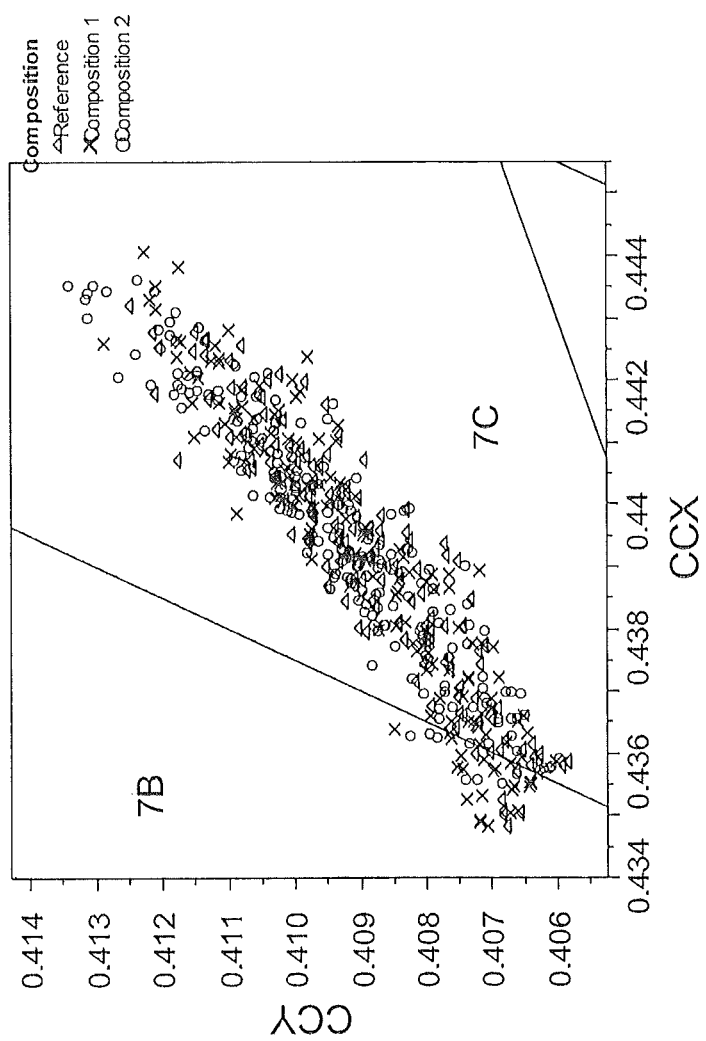
FIG. 10A shows a plot of color points for light emitting devices containing various compositions according to embodiments of the invention wherein a red phosphor is included as a secondary phosphor. The color points for 50:50 physical mixtures of LuAG:Ce/YAG:Ce that are combined with the same red phosphor are also provided for comparison.

Light emitting devices were made with example composition 1, example composition 2, and the reference composition, all using blue emitting LED dies with similar dominant wavelength and brightness. Devices with overlapping color points were selected and are plotted in FIG. 10A. As shown in FIG. 10A, in some embodiments, the compositions may be in the 7B and 7C color bins. In some embodiments, they have a color point that is within 7 MacAdam ellipses of the blackbody locus on a 1931 CIE chromaticity diagram and have a correlated color temperature of between about 2500K and about 3300K.

Figure 10B:
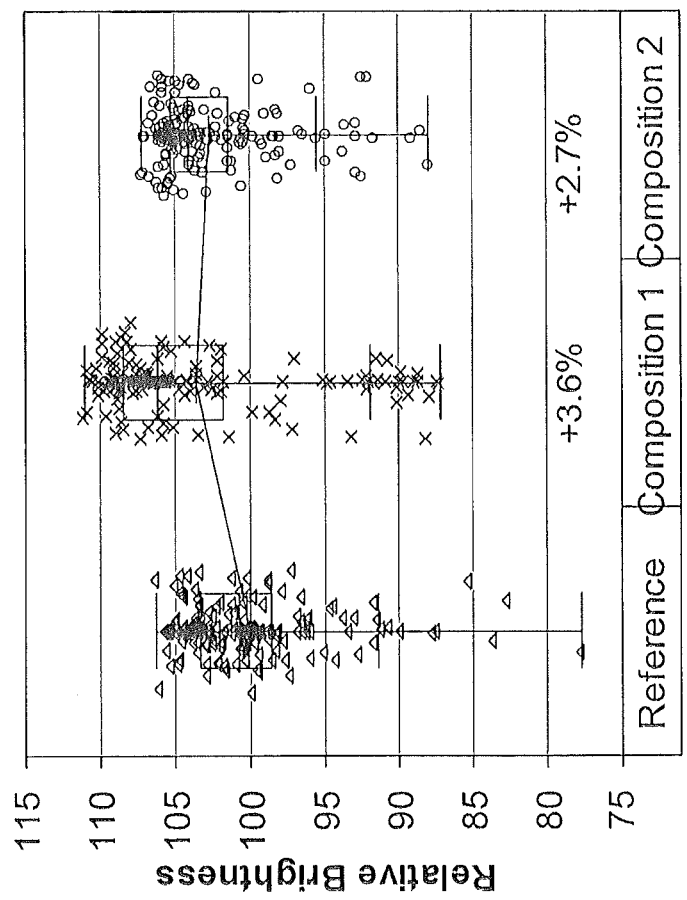
FIG. 10B shows the brightness of the points shown in FIG. 10A.
Figure 10C:
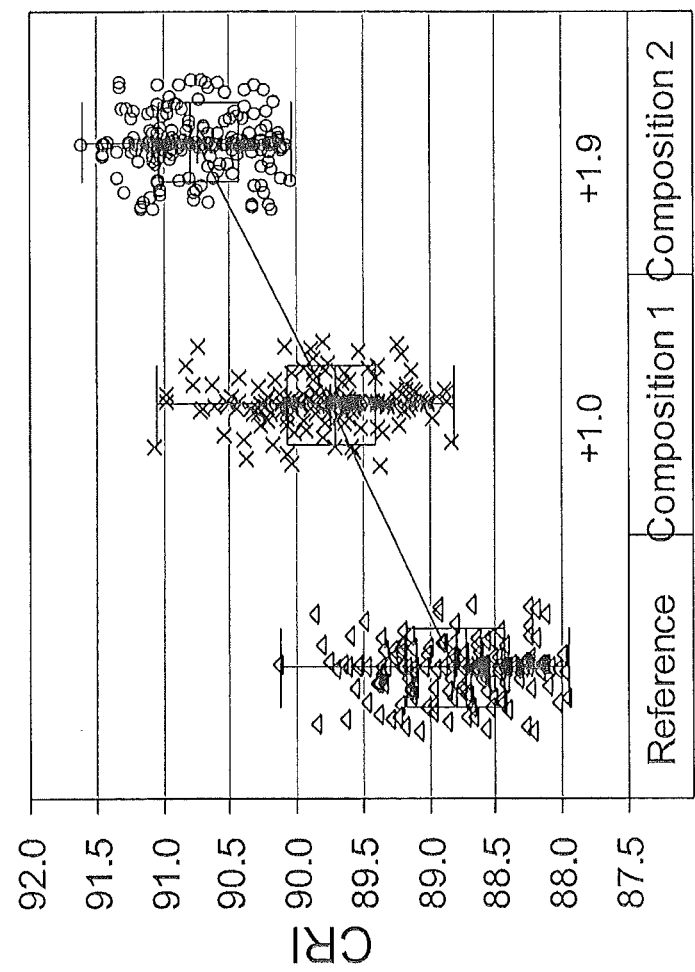
FIG. 10C shows the CRI of the points shown in FIG. 10A.
Figure 10D:
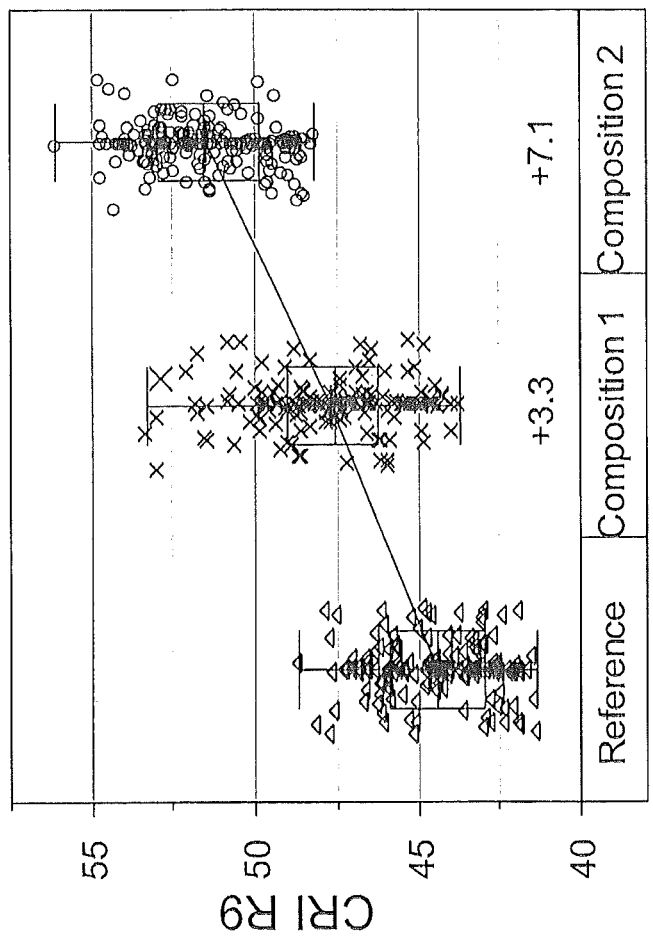
FIG. 10D shows the R9 component of the CRI for the points shown in FIG. 10A.

FIG. 10B shows that the devices made with example composition 1 and example composition 2 have similar or higher brightness compared to the devices made with the reference composition. At the same time, FIG. 10C shows that the devices made with example composition 1 and example composition 2 have higher CRI than those made with the reference composition. In some embodiments, the CRI increase is 1-2 points higher than the reference composition. As shown in FIG. 10C, in some embodiments, the CRI is in a range of 88 to 92, and in some embodiments, the CRI achieves values greater than 90. In addition, FIG. 10D shows that the devices made with example composition 1 and example composition 2 have a higher CRI R9 component than those made with the reference composition. In some embodiments, the CRI increase is 4-7 points higher than the reference composition. Certain embodiments enable some parts to achieve values of the CRI R9 component higher than 50.

As such, devices that include phosphor compositions according to an embodiment of the present invention may have same color points as those obtained by mixtures of yellow and green phosphors. In addition, such devices may achieve equivalent or higher CRI values than devices that include a mixture of yellow and green phosphors. The CRI R9 values of devices that include a phosphor composition according to an embodiment of the invention may be even more improved over reference devices (those that include a mixture of yellow and green phosphors). Further, devices according to embodiments of the invention may produce warm white light output with a relatively high luminous flux as compared to reference devices having a comparable color point.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A phosphor composition comprising:
a yttrium aluminum garnet (YAG) phosphor as a primary phosphor, the YAG phosphor comprising a YAG lattice, wherein gallium is substituted into the YAG lattice, and further comprising cerium as an activator, the cerium substituting into the YAG lattice, wherein R=(moles of cerium+moles of yttrium)/(moles of gallium+moles of aluminum) and 0.5<R<0.6, and
wherein the phosphor composition is present as particles having an average particle diameter in a range of 2 to 25 μm.

2. The phosphor composition of claim 1, wherein
(moles of cerium)/(moles of cerium+moles of yttrium)= mol % Ce and 0<mol % Ce<10; and
(moles of gallium)/(moles of gallium+moles of aluminum)= mol % Ga and 0<mol % Ga<50.

3. The phosphor composition of claim 2, wherein
2<mol % Ce<4;
10<mol % Ga<30; and
0.5<R≤0.57.

4. The phosphor composition of claim 1, wherein the phosphor composition down-converts radiation having a peak wavelength in a range of 445 nm to 470 nm to radiation having a peak wavelength in a range of 500 nm to 570 nm.

5. The phosphor composition of claim 4, further comprising a secondary phosphor such that the secondary phosphor down-converts radiation having a peak wavelength in a range of 445 nm to 470 nm to radiation having a peak wavelength in a range of 600 nm to 660 nm.

6. The phosphor composition of claim 5, wherein the primary phosphor is about 50 to 100 weight percent of the total phosphor concentration.

7. The phosphor composition of claim 5, wherein the secondary phosphor comprises a nitride and/or oxynitride phosphor.

8. The phosphor composition of claim 7, wherein the secondary phosphor comprises $(Ca_{1-x}Sr_x)SiAlN_3$:$Eu^{2+}$, where 0≤x≤1.

9. A light emitting device, comprising:
a solid state lighting source; and
a phosphor composition comprising a yttrium aluminum garnet (YAG) phosphor that has gallium substituted in the YAG phosphor,
wherein the YAG phosphor is also substituted with cerium, and
wherein R=(moles of cerium+moles of yttrium)/(moles of gallium+moles of aluminum) and 0.5<R<0.6.

10. The light emitting device of claim 9, wherein the solid state lighting source comprises a Group III nitride light emitting source.

11. The light emitting device of claim 9, wherein
(moles of cerium)/(moles of cerium+moles of yttrium)= mol % Ce and 0<mol % Ce<10; and
(moles of gallium)/(moles of gallium+moles of aluminum)= mol % Ga and 0<mol % Ga<50.

12. The light emitting device of claim 11, wherein
2<mol % Ce<4;
10<mol % Ga<30; and
0.5<R≤0.57.

13. The light emitting device of claim 9, wherein the phosphor composition down-converts radiation having a peak wavelength in a range of 445 nm to 470 nm to radiation having a peak wavelength in a range of 500 nm to 570 nm.

14. The light emitting device of claim 13, wherein the phosphor composition further comprises a secondary phosphor such that the secondary phosphor down-converts radiation having a peak wavelength in a range of 445 nm to 470 nm to radiation having a peak wavelength in a range of 600 nm to 660 nm.

15. The light emitting device of claim 14, wherein the primary phosphor is about 50 to 100 weight percent of the total phosphor concentration.

16. The light emitting device of claim 14, wherein the secondary phosphor comprises a nitride or oxynitride phosphor.

17. The light emitting device of claim 16, wherein the secondary phosphor comprises $(Ca_{1-x}Sr_x)SiAlN_3:Eu^{2+}$, where $0 \leq x \leq 1$.

18. The light emitting device of claim 9, wherein the phosphor composition further comprises a binder.

19. The light emitting device of claim 9, wherein the phosphor composition is present as particles having an average particle diameter in a range of 2 and 25 μm.

20. The light emitting device of claim 9, further comprising a separate secondary phosphor composition such that the phosphor composition and the separate secondary phosphor composition together down-convert radiation having a peak wavelength in a range of 445 nm to 470 nm to radiation having a peak wavelength in a range of 600 nm to 660 nm.

21. The light emitting device of claim 9, wherein the phosphor composition is present as a single crystal phosphor.

22. The light emitting device of claim 9, wherein the phosphor composition down-converts at least some of the radiation emitted by the solid state lighting source to a radiation having a peak wavelength greater than 580 nanometers.

23. The light emitting device of claim 9, wherein the phosphor composition down-converts at least some of the radiation emitted by the solid state lighting source to a radiation having a peak wavelength between 500 nanometers and 570 nanometers, and at least some of the radiation emitted by the solid state lighting source to a radiation having a peak wavelength between 600 nanometers and 660 nanometers.

24. The light emitting device of claim 9, wherein the solid state lighting source comprises a light emitting diode that emits light having a dominant wavelength in the blue color range.

25. The light emitting device of claim 24, wherein the dominant wavelength of the blue LED is between about 445 nm to 470 nm.

26. The light emitting device of claim 9, wherein the light emitting device emits a warm white light having a correlated color temperature between about 2500K and 4500K.

27. The light emitting device of claim 26, wherein the light emitting device emits a warm white light having a correlated color temperature between about 2500K and 3300K.

28. The light emitting device of claim 9, wherein the light emitting device has a CRI value of at least 90.

29. The light emitting device of claim 9, wherein the light emitted by the light emitting device has a color point that is within 7 MacAdam ellipses of the black-body locus on a 1931 CIE chromaticity diagram and has a correlated color temperature of between about 2500K and about 3300K.

30. The light emitting device of claim 9, wherein the light emitting device has a CRI R9 component of greater than 50.

* * * * *